Figure 1:
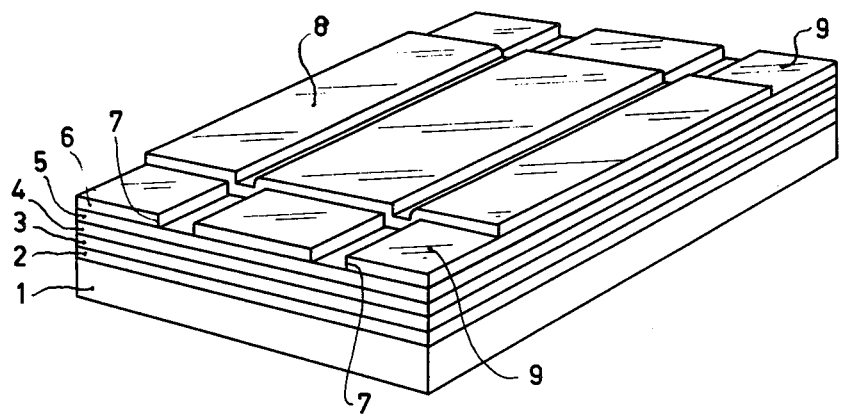

United States Patent [19]

Tijburg et al.

[11] 4,145,262

[45] Mar. 20, 1979

[54] METHOD OF MANUFACTURING A SEMICONDUCTOR DEVICE AND SEMICONDUCTOR DEVICE MANUFACTURED ACCORDING TO THE METHOD

[75] Inventors: Rudolf P. Tijburg; Teunis van Dongen, both of Eindhoven, Netherlands

[73] Assignee: U.S. Philips Corporation, New York, N.Y.

[21] Appl. No.: 887,647

[22] Filed: Mar. 17, 1978

Related U.S. Application Data

[63] Continuation of Ser. No. 771,697, Feb. 24, 1977, abandoned.

[30] Foreign Application Priority Data

Feb. 27, 1976 [NL] Netherlands .......................... 7602014

[51] Int. Cl.$^2$ .......................... C25D 9/00; C25D 9/06; C25D 11/32

[52] U.S. Cl. .................................... 204/15; 204/56 R
[58] Field of Search ................................ 204/15, 56 R

[56] References Cited

U.S. PATENT DOCUMENTS

| 3,882,000 | 5/1975 | Schwartz et al. | 204/56 R |
| 3,890,169 | 6/1975 | Schwartz et al. | 204/56 R |
| 3,984,919 | 7/1975 | Schwartz et al. | 204/56 R |

OTHER PUBLICATIONS

Schwartz, Dyment and Haszko, Proc. 4th Int. Symp. on GaAs, 1973, pp. 187–196.

*Primary Examiner*—T. M. Tufariello
*Attorney, Agent, or Firm*—Thomas A. Briody; Steven R. Biren

[57] ABSTRACT

A method of manufacturing a semiconductor device for generating laser beams is disclosed in which the mirror faces of the device are subjected to an oxidation treatment which includes an electrolytic oxidation step.

6 Claims, 2 Drawing Figures

METHOD OF MANUFACTURING A SEMICONDUCTOR DEVICE AND SEMICONDUCTOR DEVICE MANUFACTURED ACCORDING TO THE METHOD

This is a continuation of application Ser. No. 771,697, filed Feb. 24, 1977, now abandoned.

The invention relates to a method of manufacturing a semiconductor device for generating laser beams, the device comprising a semiconductor body having mirror faces accommodated transversely to the direction of the beams which reflect the said beams, said mirror faces being subjected to an oxidation treatment, and to a semiconductor device manufactured by means of the method.

A prior art method of oxidation is known from an article by Schwartz, Dyment and Haszko in Proc. 4th. Int. Symp. on GaAs and related compounds (publ. 1973) pp. 187-196.

Said article describes that an oxide which passivates lasers in a hydrous atmosphere is obtained on the mirror faces by oxidation with hydrogen peroxide solutions.

Said oxidation treatment has proved to be poorly reproducible. It has been found in practice to be particularly difficult to make hydrogen peroxide solutions with which a permanent oxide is obtained on the mirror face; the oxide is dissolved again in the presence of very small quantitites of contaminants as a result of which the mirror surface is etched.

It is the object of the invention to avoid the problems of the known methods at least to a considerable extent. It is based on the recognition of the fact that an oxidation treatment is useful in spite of the drawbacks of the known methods.

The method of the invention is therefore characterized in that the oxidation treatment includes an electrolytic oxidation step.

An oxide layer can be obtained by means of electrolytic oxidation, which layer passivates the mirror faces in a hydrous atmosphere.

For applying a voltage across the semiconductor body so as to obtain laser beams, electrodes are provided on major surfaces of the semiconductor body.

Said electrodes usually consist of silver or gold with a small quantity of beryllium or of a multi-layer system consisting of, for example, Ti or Cr and Au or Pt. Such electrodes have a comparatively small heat dissipation which is associated with a comparatively low resistance. In this respect the said electrode materials are better than aluminum with a small quantity of beryllium which has a higher contact resistance. Of course, the contact resistance of the electrode material plays an important part with the comparatively high current densities which are encountered in generating laser beams. The electrodes extend on the major surfaces up to the mirror faces. The drawback of the said gold and silver electrodes is that electrolytic oxidation of the semiconductor body also occurs below said parts of the electrodes which adjoin the mirror faces.

As a result of this the said parts do not take part in the current supply and the underlying parts of the semiconductor body operate at best to a restricted extend in generating laser beams.

In order to avoid oxidation below the electrode adjoining the mirror faces, an electrode present at a major surface of the semiconductor body, over stripes along the mirror faces, preferably consists for the greater part of aluminum.

It has been found that the semiconductor body below an aluminum layer does not oxidize upon electrolytic oxidation. In addition the contact resistance of the aluminum stripes does not interfere with the operation of the device.

After the electrolytic oxidation step a thermal treatment is preferably carried out. As a result of this, the active lifetime of the semiconductor device in general improves.

The invention furthermore relates to a semiconductor device manufactured by means of the method according to the invention.

The invention will now be described in greater detail with reference to the accompanying drawing and an example.

Figure 2:
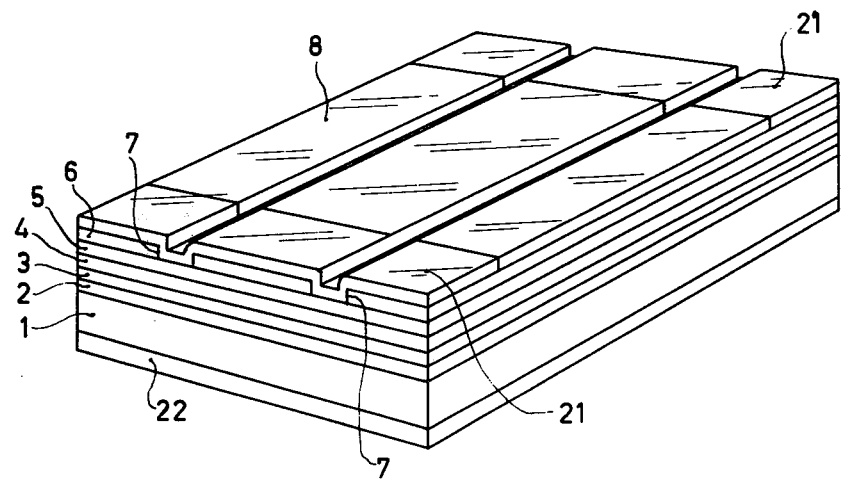

FIGS. 1 and 2 show diagrammatically, partly as an elevation and partly as a sectional view, a part of a semiconductor device in a number of stages of manufacture by means of the method according to the invention.

The starting material is a semiconductor body consisting of an n-type gallium arsenide substrate 1 which has been provided successively with an n-type aluminum gallium arsenide layer 2, a p-type gallium arsenide layer 3, a p-type aluminum gallium arsenide layer 4, and a p-type gallium arsenide layer 5 by means of liquid phase epitaxy.

The last-mentioned layer is provided pyrolytically with a 0.15 $\mu$m thick silicon oxide layer 6 in which apertures 7, 15 $\mu$m wide, pitch 300 $\mu$m, are obtained by etching.

A 0.5 $\mu$m thick, 2% beryllium-containing silver layer is vapour-deposited over the silicon oxide layer 6 and the apertures 7. The silver layer 8 contacts, via the apertures 7, the semiconductor devices to be manufactured. A plurality of apertures 9, 20 $\mu$m wide, pitch 300 $\mu$m, are etched in the silver layer 8 in a direction transverse to the longitudinal direction (also the direction of the laser beams to be generated) of the apertures 7 in the silicon oxide layer. Only two apertures 9 are shown in FIG. 1. The pitch of the apertures 9 determines the length of the part of the active layer 3 in which the laser beams are generated.

A 0.5 $\mu$m thick 2% beryllium-containing aluminum layer 21 is provided over the resulting surface, and said layer is subsequently removed again in a usual manner in those places where the silver layer 8 is still present.

An alloying treatment is then carried out in hydrogen at 580° C. for 2½ minutes.

The substrate 1 is covered with a contact layer 22 of a gold-germanium-nickel alloy.

A photoresist layer, not shown, is then provided on the aluminum and silver layers.

The assembly shown in FIG. 2 is then severed via the aluminum layers 21 transversely to the longitudinal direction of the apertures 7, mirror faces being formed which are capable of reflecting the generated laser beams.

Said mirror faces are subjected to an oxidation treatment which according to the invention includes an electrolytic oxidation step.

The semiconductor body is dipped in a bath consisting of 1 part by volume of a solution of 3% by weight of citric acid in water and 2 parts by volume of ethylene glycol.

The layer of photolacquer protects the major surfaces of the silver and aluminum layers against oxidation which occurs only on the mirror faces. Oxidation of the semiconductor body adjoining the mirror face below the aluminum layer does not occur either.

The layer of photolacquer is removed and the individual laser devices are formed by severing in a usual manner parallel to the apertures 7 and via the oxide layer 6. After the electrolytic oxidation step a thermal treatment is preferably carried out at 200° C. in air for 10 hours.

By means of the method according to the invention a laser device is obtained which, for example, has a 20 × longer lifetime than without the use of the method.

The invention is not restricted to the example described. It will be obvious to those skilled in the art that many modified embodiments may be used without departing from the scope of this invention.

What is claimed is:

1. A method of manufacturing a semiconductor device for generating laser beams, the device comprising a semiconductor body having mirror faces transverse to the direction of the beams which reflect the beams and transverse to the major surfaces of the device, which method comprises the step of subjecting said mirror faces to an oxidation treatment which includes an electrolytic oxidation step.

2. A method as claimed in claim 1, wherein the oxidation treatment is performed on a device having an electrode at a major surface of the semiconductor body which comprises mainly aluminum over stripes and extending to the mirror faces.

3. A method as claimed in claim 2, further comprising the step of subjecting the device to a thermal treatment after the electrolytic oxidation step.

4. A semiconductor device manufactured by means of the method as claimed in claim 1.

5. A method of manufacturing a semiconductor device for generating laser beams, which comprises the steps of:

providing an electrode which comprises mainly aluminum at a major surface of a semiconductor body over stripes and extending to a mirror face and adjoining the mirror face, the mirror face being transverse to the major surface and to the direction of the beams;

thereafter subjecting said mirror face to an oxidation treatment which includes an electrolytic oxidation step; and subjecting the device to a thermal treatment after the electrolytic oxidation step.

6. A method as in claim 5, wherein said electrolytic oxidation step is carried out in a bath consisting of one part by volume of a solution of 3% by weight of citric acid in water and two parts by volume of ethylene glycol, and wherein said thermal treatment is carried out at about 200° C. in air for about 10 hours.

* * * * *